United States Patent
Chen et al.

(10) Patent No.: US 9,013,865 B2
(45) Date of Patent: Apr. 21, 2015

(54) ELECTRONIC DEVICE AND SUPPORT MECHANISM THEREOF

(71) Applicant: Wistron Corp., New Taipei (TW)

(72) Inventors: Tsung-Hsien Chen, New Taipei (TW); Hsing-Wang Chang, New Taipei (TW); Po-Yuan Hsu, New Taipei (TW); Chia-Cheng Su, New Taipei (TW); Wei-Cheng Wang, New Taipei (TW)

(73) Assignee: Wistron Crop., New Taipei (TW)

( * ) Notice: Subject to any disclaimer, the term of this patent is extended or adjusted under 35 U.S.C. 154(b) by 294 days.

(21) Appl. No.: 13/692,763

(22) Filed: Dec. 3, 2012

(65) Prior Publication Data

US 2013/0335891 A1   Dec. 19, 2013

(30) Foreign Application Priority Data

Jun. 18, 2012 (TW) .............................. 101121691 A

(51) Int. Cl.
| | |
|---|---|
| H04M 1/04 | (2006.01) |
| H05K 5/02 | (2006.01) |
| F16M 11/10 | (2006.01) |
| F16M 13/00 | (2006.01) |
| G06F 1/16 | (2006.01) |

(52) U.S. Cl.
CPC .............. *H05K 5/0217* (2013.01); *F16M 11/10* (2013.01); *F16M 13/005* (2013.01); *H04M 1/04* (2013.01); *G06F 1/1626* (2013.01); *G06F 1/166* (2013.01)

(58) Field of Classification Search
CPC ........ G06F 1/1626; G06F 1/166; H04M 1/04; F16M 11/10

USPC .................................................... 361/679.55
See application file for complete search history.

(56) References Cited

U.S. PATENT DOCUMENTS

| | | | | |
|---|---|---|---|---|
| 5,436,792 | A  * | 7/1995 | Leman et al. ............ | 361/679.44 |
| 5,917,907 | A  * | 6/1999 | Kela .............................. | 379/446 |
| 6,651,943 | B2 * | 11/2003 | Cho et al. .................... | 248/122.1 |
| 6,840,791 | B2 * | 1/2005 | Hsiu ............................. | 439/374 |
| 6,971,622 | B2 * | 12/2005 | Ziegler et al. ................. | 248/454 |
| 7,540,466 | B2 * | 6/2009 | Yang ............................. | 248/688 |
| 7,573,703 | B2 * | 8/2009 | Chuang et al. ........... | 361/679.27 |

(Continued)

FOREIGN PATENT DOCUMENTS

| | | |
|---|---|---|
| TW | M412586 U1 | 9/2011 |
| TW | M414798 U1 | 10/2011 |

OTHER PUBLICATIONS

Taiwan Patent Office, Office Action, Patent Application Serial No. 101121691, Oct. 27, 2014, Taiwan.

*Primary Examiner* — David M Sinclair
*Assistant Examiner* — Robert Brown

(57) ABSTRACT

An electronic device is provided, including a main body and a support mechanism. The main body forms a U-shaped recess. The support mechanism includes a U-shaped support, two pivot members and an electrical connection port. The support forms two ends, and the pivot members rotatably connect the two ends to the main body. The electrical connection port is disposed on the support. When the support is in a closed angle position that is relative to the main body, the support is received in the recess and parallel to the main body, and the electrical connection port is covered by the main body. When the support is rotated relative to the main body and is released from the recess, the electronic device can stand on a surface by the support, and the electrical connection port is exposed to a surface of the support.

10 Claims, 5 Drawing Sheets

(56) References Cited

U.S. PATENT DOCUMENTS

| | | | |
|---|---|---|---|
| 7,614,599 B2* | 11/2009 | Moon et al. | 248/454 |
| 7,669,829 B2* | 3/2010 | Ogatsu | 248/682 |
| 7,702,297 B2* | 4/2010 | Wu | 455/90.3 |
| 7,869,200 B2* | 1/2011 | Horie | 361/679.02 |
| 7,878,473 B1* | 2/2011 | Oh | 248/339 |
| 7,878,474 B1* | 2/2011 | Richer et al. | 248/351 |
| 8,072,744 B2* | 12/2011 | Wang | 361/679.29 |
| 8,081,429 B2* | 12/2011 | Horie | 361/679.02 |
| 8,128,054 B2* | 3/2012 | Li | 248/685 |
| 8,177,175 B2* | 5/2012 | Chang | 248/168 |
| 8,262,053 B1* | 9/2012 | Zhao | 248/676 |
| 8,274,784 B2* | 9/2012 | Franz et al. | 361/679.21 |
| 8,411,055 B2* | 4/2013 | Cheng et al. | 345/173 |
| 8,457,696 B2* | 6/2013 | Pegg | 455/575.3 |
| 8,508,923 B2* | 8/2013 | Chao | 361/679.02 |
| 8,534,635 B2* | 9/2013 | Yang et al. | 248/458 |
| 8,537,533 B2* | 9/2013 | Sung | 361/679.28 |
| 8,648,821 B2* | 2/2014 | Wu et al. | 345/173 |
| 2002/0130243 A1* | 9/2002 | Ziegler et al. | 248/685 |
| 2004/0007649 A1* | 1/2004 | Vettraino | 248/127 |
| 2004/0155859 A1* | 8/2004 | Lee | 345/156 |
| 2005/0156902 A1 | 7/2005 | McPherson et al. | |
| 2005/0257341 A1* | 11/2005 | Chen et al. | 16/17.1 |
| 2006/0108494 A1* | 5/2006 | Lancet | 248/456 |
| 2006/0186282 A1* | 8/2006 | Ko et al. | 248/127 |
| 2006/0226307 A1* | 10/2006 | Kim et al. | 248/121 |
| 2006/0231711 A1* | 10/2006 | Shin | 248/291.1 |
| 2006/0287017 A1* | 12/2006 | Wu | 455/575.7 |
| 2007/0040079 A1* | 2/2007 | Liang et al. | 248/146 |
| 2007/0075201 A1* | 4/2007 | Shi et al. | 248/288.11 |
| 2007/0159778 A1* | 7/2007 | Lin et al. | 361/683 |
| 2007/0221811 A1* | 9/2007 | Hauser et al. | 248/454 |
| 2007/0265030 A1* | 11/2007 | Moon et al. | 455/550.1 |
| 2008/0062624 A1* | 3/2008 | Regen et al. | 361/680 |
| 2008/0073192 A1* | 3/2008 | Lee | 200/333 |
| 2008/0096620 A1* | 4/2008 | Lee et al. | 455/575.8 |
| 2008/0274774 A1* | 11/2008 | Kim | 455/575.1 |
| 2009/0127423 A1* | 5/2009 | Chen et al. | 248/447 |
| 2009/0231797 A1* | 9/2009 | Kim | 361/679.27 |
| 2009/0261216 A1* | 10/2009 | Yang et al. | 248/168 |
| 2009/0262079 A1* | 10/2009 | Bury et al. | 345/169 |
| 2009/0318195 A1* | 12/2009 | Hiraoka | 455/566 |
| 2009/0321609 A1* | 12/2009 | Wang et al. | 248/685 |
| 2010/0014229 A1* | 1/2010 | Horie | 361/679.01 |
| 2010/0276553 A1* | 11/2010 | Li | 248/121 |
| 2010/0317413 A1* | 12/2010 | Tan | 455/573 |
| 2011/0050606 A1* | 3/2011 | Zhang et al. | 345/173 |
| 2011/0286171 A1* | 11/2011 | Franz et al. | 361/679.21 |
| 2012/0037047 A1* | 2/2012 | Moldovan | 108/3 |
| 2012/0055005 A1* | 3/2012 | Carnevali | 29/428 |
| 2012/0057294 A1* | 3/2012 | Kim | 361/679.41 |
| 2012/0063068 A1* | 3/2012 | Li | 361/679.01 |
| 2012/0069496 A1* | 3/2012 | Wong et al. | 361/679.01 |
| 2012/0140390 A1* | 6/2012 | Iwai et al. | 361/679.01 |
| 2012/0162102 A1* | 6/2012 | Cheng et al. | 345/173 |
| 2012/0168590 A1* | 7/2012 | Yang et al. | 248/346.3 |
| 2012/0176742 A1* | 7/2012 | Luo | 361/679.26 |
| 2012/0178507 A1* | 7/2012 | Lee | 455/575.1 |
| 2012/0182227 A1* | 7/2012 | Wu et al. | 345/173 |
| 2012/0223194 A1* | 9/2012 | Huang et al. | 248/176.1 |
| 2012/0261305 A1* | 10/2012 | Sung | 206/736 |
| 2012/0262853 A1* | 10/2012 | Sung | 361/679.01 |
| 2012/0275131 A1* | 11/2012 | Huang et al. | 361/810 |
| 2012/0281343 A1* | 11/2012 | Cheng et al. | 361/679.01 |
| 2012/0293931 A1* | 11/2012 | Liu et al. | 361/679.02 |
| 2012/0320514 A1* | 12/2012 | Franz et al. | 361/679.26 |
| 2012/0325986 A1* | 12/2012 | Chen et al. | 248/122.1 |
| 2013/0001378 A1* | 1/2013 | Chen et al. | 248/121 |
| 2013/0043243 A1* | 2/2013 | Shifferaw | 220/8 |
| 2013/0044408 A1* | 2/2013 | Hofer | 361/679.01 |
| 2013/0079066 A1* | 3/2013 | Chan | 455/575.1 |
| 2013/0107427 A1* | 5/2013 | Cheng | 361/679.01 |
| 2013/0163197 A1* | 6/2013 | Mack et al. | 361/679.56 |
| 2013/0222989 A1* | 8/2013 | Chen | 361/679.02 |
| 2013/0299663 A1* | 11/2013 | Pan et al. | 248/371 |

* cited by examiner

ELECTRONIC DEVICE AND SUPPORT MECHANISM THEREOF

CROSS REFERENCE TO RELATED APPLICATIONS

This Application claims priority of Taiwan Patent Application No. 101121691, filed on Jun. 18, 2012, the entirety of which is incorporated by reference herein.

BACKGROUND OF THE INVENTION

1. Field of the Invention

The application relates in general to an electronic device, and in particular, to an electronic device having a support mechanism.

2. Description of the Related Art

Most of the conventional portable electronic devices, such as tablet computers or mobile communication devices, can play multimedia content. Users usually have to hold the electronic devices when viewing the content that is displayed. Since the electronic devices have streamlined appearances and smooth surfaces, it is difficult for users to hold the electronic devices. Additional frames may be provided to support the electronic devices on a surface, but they may increase manufacturing costs and structural complexity of the electronic devices.

BRIEF SUMMARY OF INVENTION

An embodiment of the invention provides an electronic device, comprising a main body, and a support mechanism. The main body forms a U-shaped recess, and the support mechanism comprises a U-shaped support, two pivot members, and an electrical connection port. The U-shaped support forms two ends, the two pivot members pivotally connect the two ends to the main body, respectively, and the electrical connection port is disposed on the support. When the support is in a closed angle position that is relative to the main body, the support is received in the recess and parallel to the main body, and the electrical connection port is covered by the main body. When the support is rotated relative to the main body and is released from the recess, the electrical connection port is exposed to a surface of the support.

An embodiment of the invention provides a support mechanism, connected to a main body of an electronic device, wherein the main body forms a U-shaped recess, and the support mechanism comprises a U-shaped support, two pivot members, and an electrical connection port. The U-shaped support forms two ends, the two pivot members pivotally connect the two ends to the main body, respectively, and the electrical connection port is disposed on the support. When the support is in a closed angle position that is relative to the main body, the support is received in the recess and parallel to the main body, and the electrical connection port is covered by the main body. When the support is rotated relative to the main body and is released from the recess, the electrical connection port is exposed to a surface of the main body.

DETAILED DESCRIPTION OF INVENTION

Figure 1A:
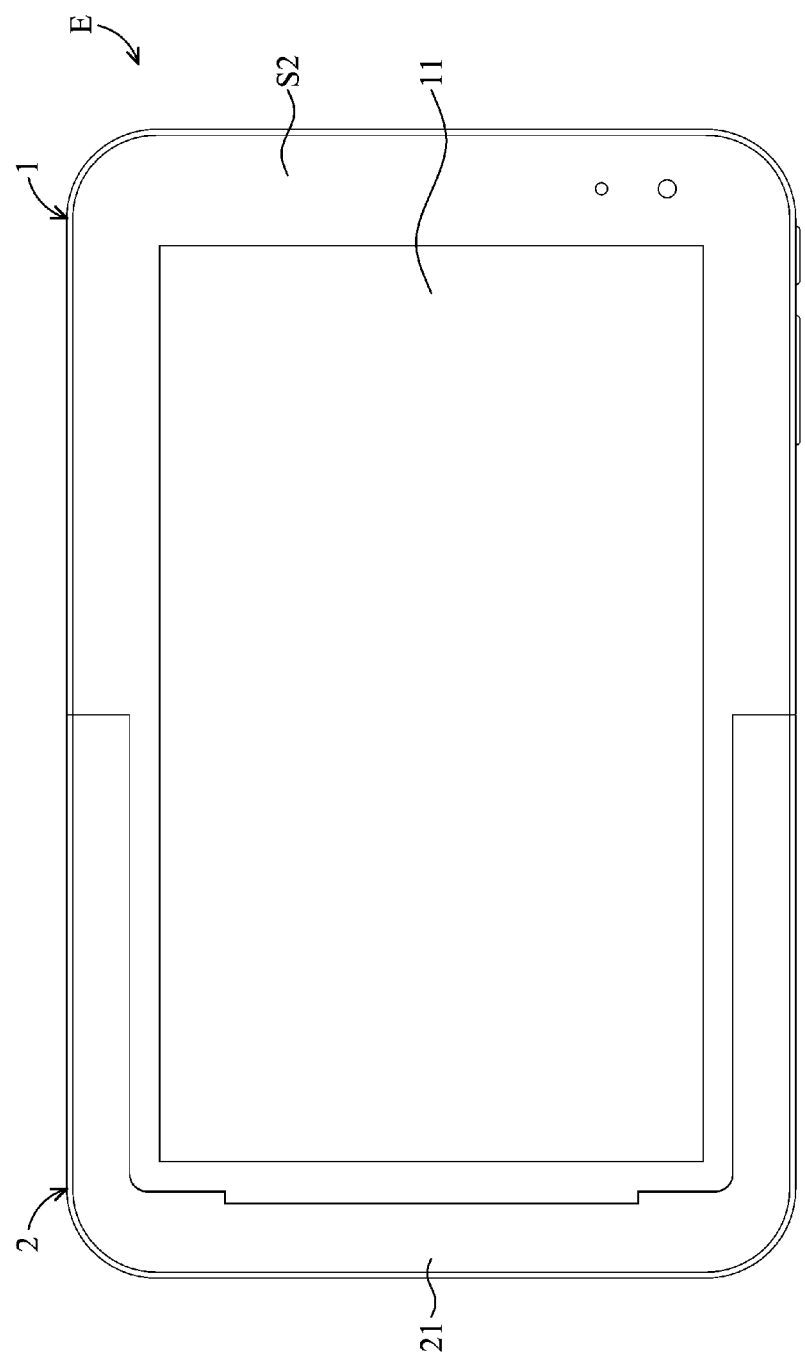
FIG. 1A is a perspective diagram of an electronic device having a support in a closed angle position that is relative to the main body.

Referring to FIGS. 1A-3, an embodiment of an electronic device E, such as a tablet PC or a mobile communication device, primarily comprises a main body 1 and a support mechanism 2. The main body 1 forms a U-shaped recess 12 (FIGS. 2A and 2B) and has a display module 11 with a touch screen. The support mechanism 2 comprises an approximately U-shaped support 21 corresponding to the U-shaped recess 12, and the support 21 is pivotally connected to opposite sides of the main body 1 and rotatable relative to the main body 1.

Figure 2A:
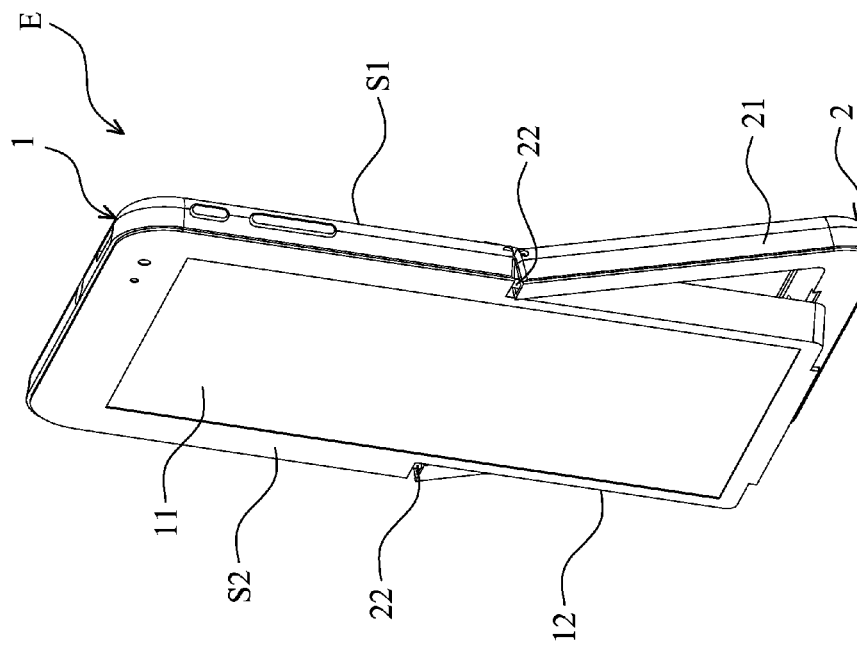
FIG. 2A is a perspective diagram of an electronic device having a support that is rotated to a position that is relative to the main body and is released from the recess.

As shown in FIGS. 1A and 2A, when the support 21 is in a closed angle position that is relative to the main body 1, the support 21 is received in the U-shaped recess 12 of the main body 1 and parallel thereto. Referring to FIG. 2A, when the support 21 is rotated to an angle that is relative to the main body 1, the support 21 can support the main body 1 to stand on a supporting surface, so that users can conveniently view or operate the electronic device E without holding it.

Figure 3:
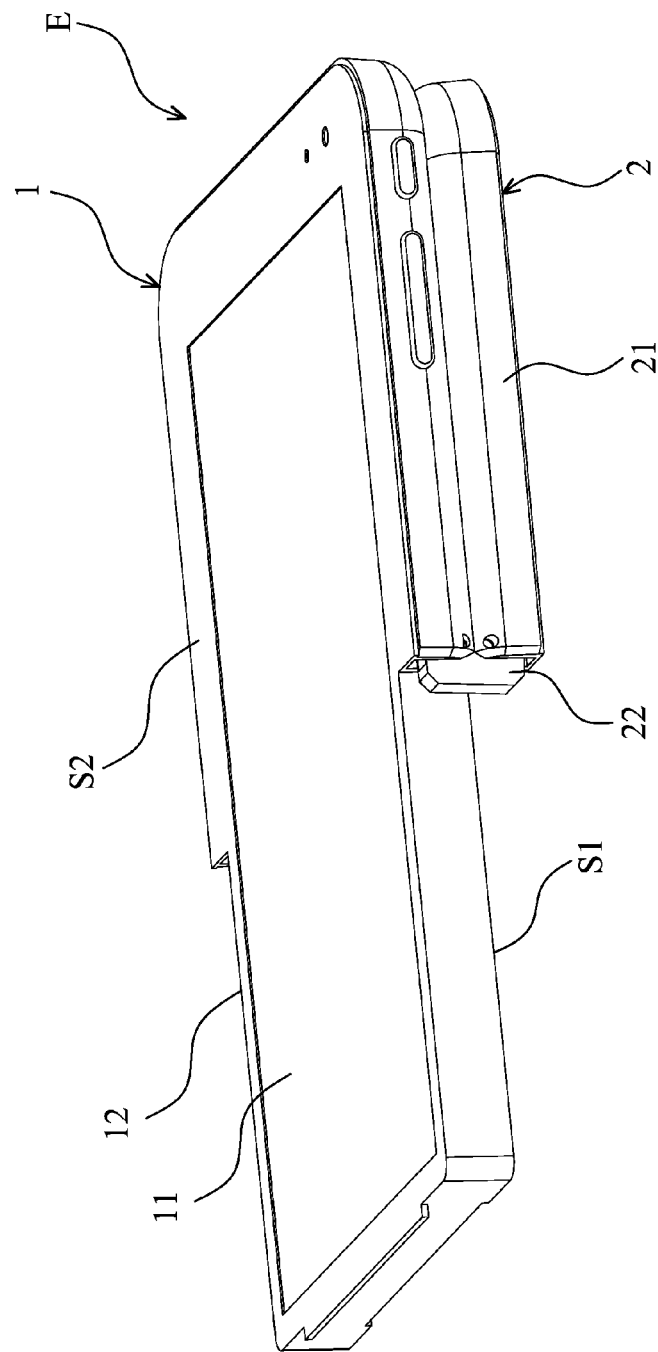
FIG. 3 is a perspective diagram of an electronic device having a support that is rotated to a position that is a limiting angle, parallel to the main body.

Additionally, when users need to hold the electronic device E for viewing or operating, the support 21 can be rotated 180 degrees to a limiting angle relative to the main body 1, such that the support 21 protrudes from a first surface S1 of the main body 1 and is parallel thereto (as shown in FIG. 3). In this state, users may conveniently hold and operate the electronic device E.

Figure 2B:
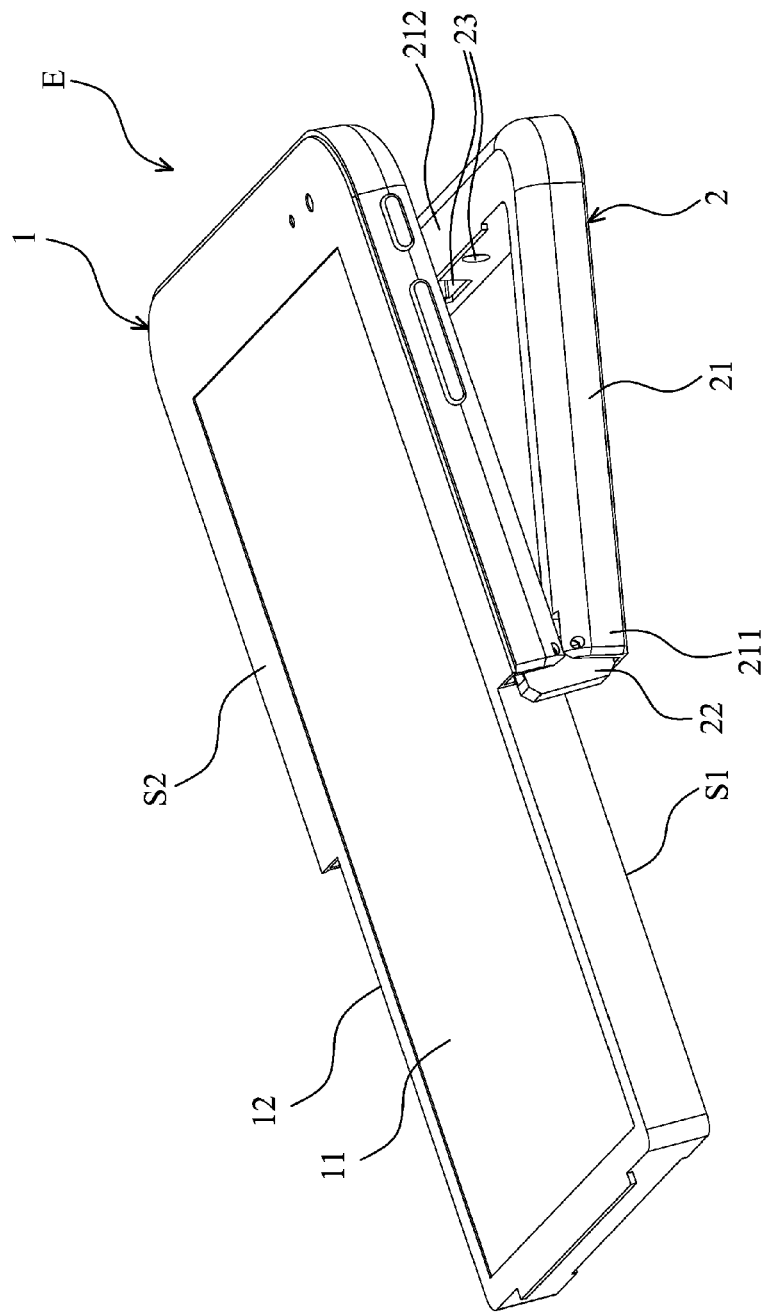
FIG. 2B is a perspective diagram of an electronic device having a support that is rotated to a position that is relative to the main body and is released from the recess.

Referring to FIG. 2B, the support mechanism 2 primarily comprises a support 21, two pivot members 22, and at least one electrical connection port 23. The support 21 has an approximately U-shaped structure forming two ends 211 and a holding portion 212. The pivot members 22 pivotally connect the two ends 211 to opposite sides of the main body 1, respectively, and the electrical connection port 23 is disposed on an inner surface of the holding portion 212. The display module 11 is disposed on a second surface S2 of the main body 1, opposite to the first surface S1. It should be noted that the U-shaped recess 12 is formed on three adjacent sides of the main body 1, corresponding to the support 21.

Figure 1B:
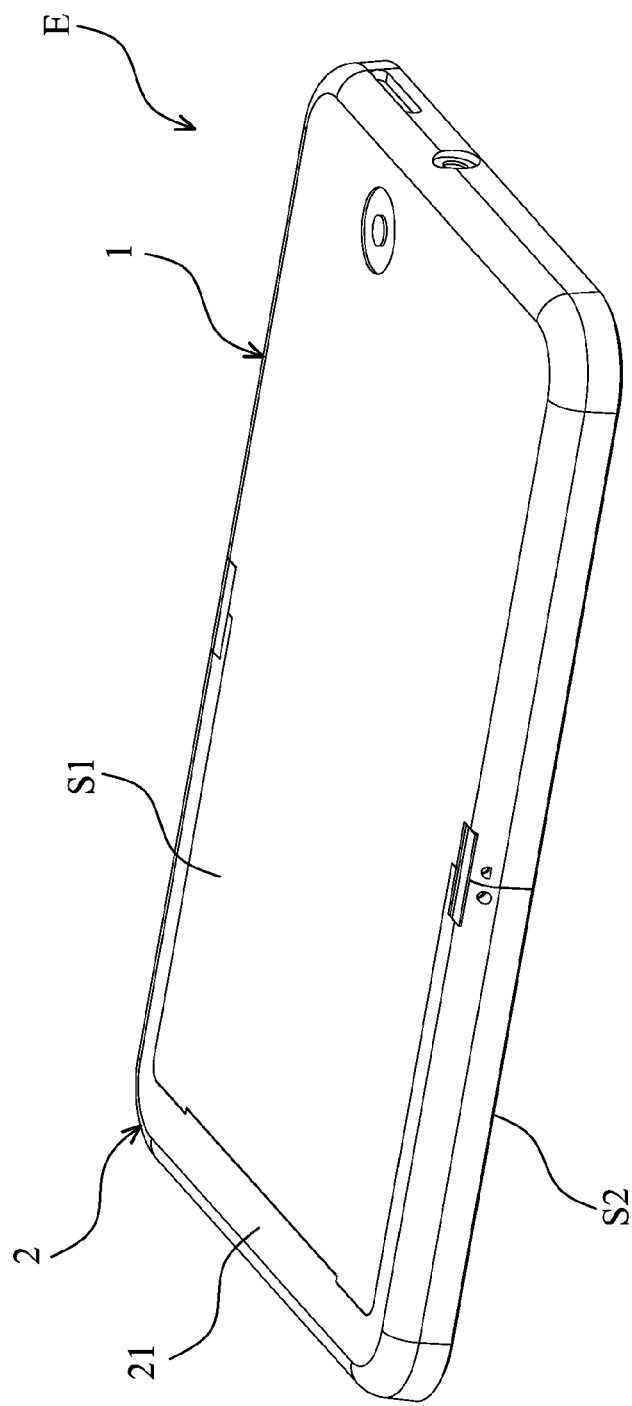
FIG. 1B is a perspective diagram of an electronic device having a support in a closed angle position that is relative to the main body.

Referring to FIGS. 1A-1B, when the support 21 is in the closed angle position that is relative to the main body 1, it is received in the U-shaped recess 12 of the main body 1 and around a part thereof. In this state, the support 21 is parallel to the main body 1, and the electrical connection port 23 is covered by the main body 1 to prevent dust from entering into the electrical connection port 23.

As shown in FIGS. 2A and 2B, the support 21 may rotate relative to the main body 1 and be released from the U-shaped recess 12, wherein the rotated angle of the support 21 relative to the main body 1 can be adjusted for viewing or operating the electronic device E. As shown in FIG. 2A, when the electronic device E is placed on a desktop, the rotated angle may be less than 90 degrees, such that the support mechanism 2 can support the main body 1 to stand on the desktop. As shown in FIG. 2B, when the rotated angle exceeds 90 degrees, the main body 1 can approximately lie on the desktop.

Namely, users can arbitrarily adjust the posture of the electronic device E to conveniently view or operate the electronic device E without holding it.

Referring to FIG. 2B, when the support 21 rotates relative to the main body 1 and is released from the U-shaped recess 12, the electrical connection port 23 is exposed to an inner surface of the support 21. The electronic device E can therefore electrically connect to peripheral devices through the exposed electrical connection port 23.

Referring to FIG. 3, when the support 21 rotates to a limiting angle, parallel to the main body 1, the support 21 and the U-shaped recess 12 are on opposite sides of the main body 1. Specifically, the support 21 protrudes from the first surface S1 of the main body 1 for users to grab. In this embodiment, users may hold the main body 1 by grabbing the holding portion 212 of the support 21 for conveniently viewing or operating the electronic device E.

The invention provides an electronic device, primarily comprising a main body and a support mechanism. The main body forms a U-shaped recess, and the support mechanism primarily comprises a U-shaped support, two pivot members, and an electrical connection port. The support forms two ends, and the pivot members pivotally connect the two ends to the main body, and the electrical connection port is disposed on the support. When the support is in a closed angle position that is relative to the main body, it is received in the U-shaped recess and parallel to the main body, and the electrical connection port is covered by the main body. When the support is rotated relative to the main body and is released from the U-shaped recess, the support can facilitate the electronic device to stand on a desktop, so that users can conveniently view or operate the electronic device with the electrical connection port exposed on a surface of the support. When the support is rotated to a limiting angle relative to the main body, the support protrudes from a first surface of the main body for users to grab. Accordingly, users can conveniently hold and operate the electronic device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
   a main body, forming a U-shaped recess;
   a support mechanism, comprising:
   a U-shaped support, forming two ends;
   two pivot members, pivotally connecting the two ends with the main body respectively; and
   an electrical connection port, disposed on the support,
   wherein when the support is in a closed angle position that is relative to the main body, the support is received in the recess and parallel to the main body, and the electrical connection port is covered by the main body, and when the support is rotated relative to the main body and is released from the recess, the electrical connection port is exposed to a surface of the support.

2. The electronic device as claimed in claim 1, wherein when the support is rotated relative to the main body to a limiting angle, the support protrudes from a first surface of the main body, and the support and the recess are on opposite sides of the main body.

3. The electronic device as claimed in claim 2, wherein the main body comprises a display module disposed on a second surface of the main body, opposite to the first surface.

4. The electronic device as claimed in claim 2, wherein when the support is rotated relative to the main body to the limiting angle, the support abuts the main body and is parallel thereto.

5. The electronic device as claimed in claim 1, wherein when the support is in the closed angle position that is relative to the main body, the support is situated around a part of the main body.

6. The electronic device as claimed in claim 1, wherein the pivot members are pivotally connected to opposite sides of the main body.

7. A support mechanism connected to a main body of an electronic device, wherein the main body forms a U-shaped recess, the support mechanism comprising:
   a U-shaped support, forming two ends;
   two pivot members, pivotally connecting the two ends with the main body respectively; and
   an electrical connection port, disposed on the support,
   wherein when the support is in a closed angle position that is relative to the main body, the support is received in the recess and parallel to the main body, and the electrical connection port is covered by the main body, and when the support is rotated relative to the main body and is released from the recess, the electrical connection port is exposed to a surface of the main body.

8. The support mechanism as claimed in claim 7, wherein when the support is rotated relative to the main body to a limiting angle, the support protrudes from a first surface of the main body, and the support and the U-shaped recess are on opposite sides of the main body.

9. The support mechanism as claimed in claim 8, wherein when the support is rotated relative to the main body to the limiting angle, the support abuts the main body and is parallel thereto.

10. The support mechanism as claimed in claim 7, wherein when the support is in the closed angle position that is relative to the main body, the support is situated around a part of the main body.

* * * * *